United States Patent
Chang et al.

(10) Patent No.: US 11,340,679 B1
(45) Date of Patent: May 24, 2022

(54) UNINTERRUPTIBLE POWER SYSTEM TESTING METHOD

(71) Applicant: Dynapack International Technology Corporation, Taoyuan (TW)

(72) Inventors: Chung-Hsing Chang, Taoyuan (TW); Heng-Yi Cheng, Taoyuan (TW); Po-Han Lee, Taoyuan (TW); Chien-Yueh Tung, Taoyuan (TW); Kun-Fu Lee, Taoyuan (TW); Chung-Chih Tseng, Taoyuan (TW)

(73) Assignee: DYNAPACK INTERNATIONAL TECHNOLOGY CORPORATION, Taoyuan (TW)

( * ) Notice: Subject to any disclaimer, the term of this patent is extended or adjusted under 35 U.S.C. 154(b) by 0 days.

(21) Appl. No.: 17/308,589

(22) Filed: May 5, 2021

(51) Int. Cl.
*G01R 31/36* (2020.01)
*G06F 1/28* (2006.01)

(52) U.S. Cl.
CPC ..................................... *G06F 1/28* (2013.01)

(58) Field of Classification Search
CPC ........ G06F 1/28; G01R 31/367; G01R 31/392
See application file for complete search history.

(56) References Cited

U.S. PATENT DOCUMENTS

| | | | | |
|---|---|---|---|---|
| 2004/0215408 | A1* | 10/2004 | Lamer | G06F 1/3203 702/63 |
| 2009/0024863 | A1* | 1/2009 | Karstens | G06F 1/28 713/340 |
| 2015/0360578 | A1* | 12/2015 | Duan | B60L 58/12 340/455 |

* cited by examiner

*Primary Examiner* — Mark A Connolly
(74) *Attorney, Agent, or Firm* — Rabin & Berdo, P.C.

(57) ABSTRACT

An uninterruptible power system (UPS) testing method includes the steps of setting an operational decline table, setting an initial value, collecting data, inputting targets, executing multi-algorithm, and indicating a warning or an approval. Wherein, battery cells of the UPS are repeatedly tested when being actually used at different temperatures to set the operational decline table and the initial time value; and data about temperatures and time periods of the battery in operation are continuously collected for a user to execute algorithms based on designated conditions to predict the battery state in a future time period; and an indication message is generated for the user to determine whether the battery is still usable or has to be replaced. In this manner, it is able to estimate the running time of a target time of the UPS without the need of performing an actual electrical discharge procedure.

7 Claims, 8 Drawing Sheets

| Operational decline table (mins x $10^{-3}$ / day) | | | | | |
|---|---|---|---|---|---|
|  | 25°C | 30°C | 35°C | 40°C | 50°C |
| first year | 1.00 | 1.10 | 1.30 | 1.40 | 1.80 |
| second year | 0.40 | 0.50 | 0.55 | 1.10 | 1.30 |
| third year | 0.30 | 0.35 | 0.40 | 0.60 | 1.10 |
| fourth year | 0.20 | 0.25 | 0.30 | 0.50 | 0.90 |
| fifth year | 0.15 | 0.20 | 0.25 | 0.40 | 0.80 |

UNINTERRUPTIBLE POWER SYSTEM TESTING METHOD

FIELD OF THE INVENTION

The present invention relates to an uninterruptible power system (UPS) testing method, and more particularly, to a battery state-of-health (SOH) testing method using an operational decline table for estimating whether a battery can still meet required power supply in a future time period.

BACKGROUND OF THE INVENTION

Generally, an uninterruptible power system (UPS) is mainly used to provide stable and uninterrupted power to computer systems, other data processing systems, wireless communication base stations or medical equipment. When an alternating current (AC) power source supplies power in a normal state, the AC power is directly supplied to a system. However, in the event the supply of AC power stops due to an emergency, the uninterruptible power system would immediately invert a direct current (DC) power source from UPS internal batteries into a backup AC power, and the backup AC power from the UPS can still be supplied to the system requiring power, enabling the system to keep normal operation.

However, in the case the UPS has too many loads connected thereto, it is possible the power supplied by the UPS could not be efficiently distributed, leading the loads to shut off in a non-optimal state. Therefore, further functions, such as battery residual power management, optimal distribution of power, reminding user the battery level remaining, and monitoring of battery life, have been developed for the UPS.

The conventional UPS monitors a plurality of environmental parameters of the uninterruptible power supply on a periodical basis and regulates at least one testing parameter for battery testing based on the monitored environmental parameters. Wherein, the at least one testing parameter includes a time period remained until next scheduled battery testing, and the time period remained is kept by a calibration timer. Further, the calibration timer can also be adjusted according to the data of the environmental parameters.

From the above description, it can be found that, for the conventional UPS to execute an algorithm for an expected time period of use, it requires the battery thereof to undergo an actual electrical discharge procedure to enable the calibration of the testing parameter data, in order to accurately estimate a target time.

SUMMARY OF THE INVENTION

A primary object of the present invention is to provide an uninterruptible power system testing method, an operational decline table is set in advance for assessing the state of a battery in a future period of time, so that it is able to directly complete an estimation of the battery state-of-health at a target time while the uninterruptible power system need not to undergo an actual electrical discharge procedure, which further enables simplified hardware requirement and eliminates the need for additional electrical discharge to thereby reduce the manufacturing cost of the uninterruptible power system.

Another object of the present invention is to provide an uninterruptible power system testing method, in which an operational decline table being used combines actual test data and simulated data to enable largely reduced time needed to set data and upgraded battery state-of-health accuracy.

A further object of the present invention is to provide an uninterruptible power system testing method, which is able to periodically execute algorithms on a plurality of continuously stored test data and delete the used test data after the periodic algorithms, so that the capacity required by a storage unit of the uninterruptible power system can be largely reduced.

To achieve the above and other objects, the uninterruptible power system testing method according to the present invention includes a table setting step, an initial value setting step, a data collecting step, a target input step, a multi-algorithm step, and an indicating step. Wherein, the multi-algorithm step further includes a first algorithm step, a second algorithm step, a third algorithm step, and a fourth algorithm step.

In the table setting step, cells of a power supply of the uninterruptible power system (UPS) are repeatedly tested when they are actually used at different temperatures, so as to set an operational decline table; and the operational decline table is stored in a storage unit of the UPS and includes a plurality of set temperature values, a plurality of time parameter values and a plurality of coefficients of decline.

In the initial value setting step, an electrical discharge time of each cell is used to generate an initial time value matching the plurality of cells of the power supply, and the initial time value is stored in the storage unit.

In the data collecting step, a plurality of temperature sensors are used to continuously collect a plurality of real-time temperature values of the power supply, and a timer is used to obtain a continued time period of each of the real-time temperature values; and the real-time temperature values and the continued time periods are stored in the storage unit.

In the target input step, a predicted time interval value, a target temperature, a target time value and an execute algorithm instruction are generated by operating at an operational interface of the UPS; and the generated predicted time interval value, target temperature, target time value and execute algorithm instruction are transmitted to a microprocessor of the UPS.

In the multi-algorithm step, multiple algorithms are executed base on the received real-time temperature values, continued time periods, operational decline table, initial time value, predicted time interval value, target temperature and target time value to generate a control instruction.

The multi-algorithm step further includes a first algorithm step, in which the microprocessor executes an algorithm based on an accumulation of the continued time periods of the real-time temperature values, so as to derive a plurality of time proportions with each of the set temperature values having a single matching time proportion; a second algorithm step, in which the microprocessor generates a current time value for a current state according to the operational decline table, the time proportions and the initial time value; a third algorithm step, in which the microprocessor generates a predicted time value according to the operational decline table, the predicted time interval value and the target temperature; and a fourth algorithm step, in which the microprocessor generates the control instruction according to the current time value, the predicted time value and the target time value.

In the indicating step, an indicator of the UPS receives the control instruction and accordingly, gives a warning indication or an approval indication.

The uninterruptible power system testing method of the present invention further includes a time updating step, in which the storage unit stores the current time value in replace of the initial time value to form an updated time value and deletes the previously stored real-time temperature values and continued time periods; a target re-input step, in which an updated predicted time interval value, an updated target temperature, an updated target time value and a re-execute algorithm instruction are generated through an operation at the operational interface; and a re-indicating step, in which the indicator receives a further control instruction from the microprocessor to give the warning indication or the approval indication. Wherein, the microprocessor repeats the first to fourth algorithm steps to generate the further control instruction, and the current time value is generated according to the operational decline table, the time proportions and the updated time value.

In an operable embodiment, a partial data of the operational decline table is actual test data produced from the actual operation of the cells, and other data of the operational decline table are simulated algorithmic data produced from calculation performed on the actual test data.

The highest temperature among the real-time temperature values of the same time sequence is set by the microprocessor as an algorithmic temperature, and a plurality of algorithmic temperatures that matches the set temperature values are used to accumulate the continued time period of each of the set temperature values.

The target temperature is generated in one of two different manners. In the first manner, one set temperature value having a continued time period of a highest proportion among all continued time periods is selected by the microprocessor as the target temperature. In the second manner, one of many temperatures is generated by the operational interface for use as the target temperature.

The present invention is characterized in that an operational decline table and an initial time value are set for the uninterruptible power system, and the microprocessor would execute multiple times of algorithms based on a plurality of parameters, including the operational decline table, the actual real-time temperature value and the continued time periods, so that the uninterruptible power system can quickly complete the assessment of the required power supply at a target time without involving an actual electrical discharge procedure or other calibration procedures.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

The present invention will now be described with some preferred embodiments thereof and by referring to the accompanying drawings.

Figure 1:
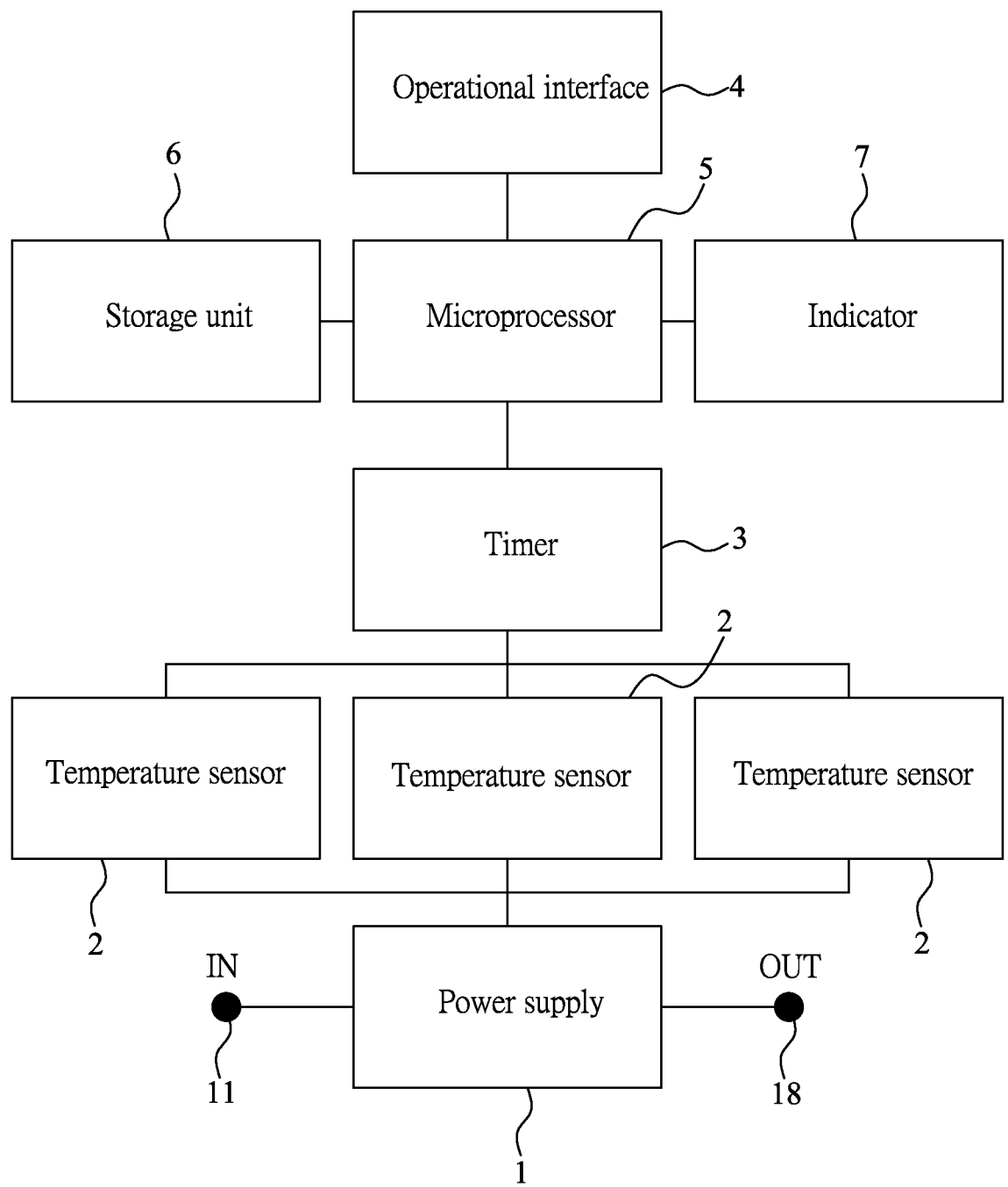
FIG. 1 is a block diagram of an uninterruptible power system on which the testing method according to the present invention is implemented.

Please refer to FIG. 1. An uninterruptible power system according to the present invention includes a power supply 1, a plurality of temperature sensors 2, a timer 3, an operational interface 4, a microprocessor 5, a storage unit 6, and an indicator 7.

Figure 2:
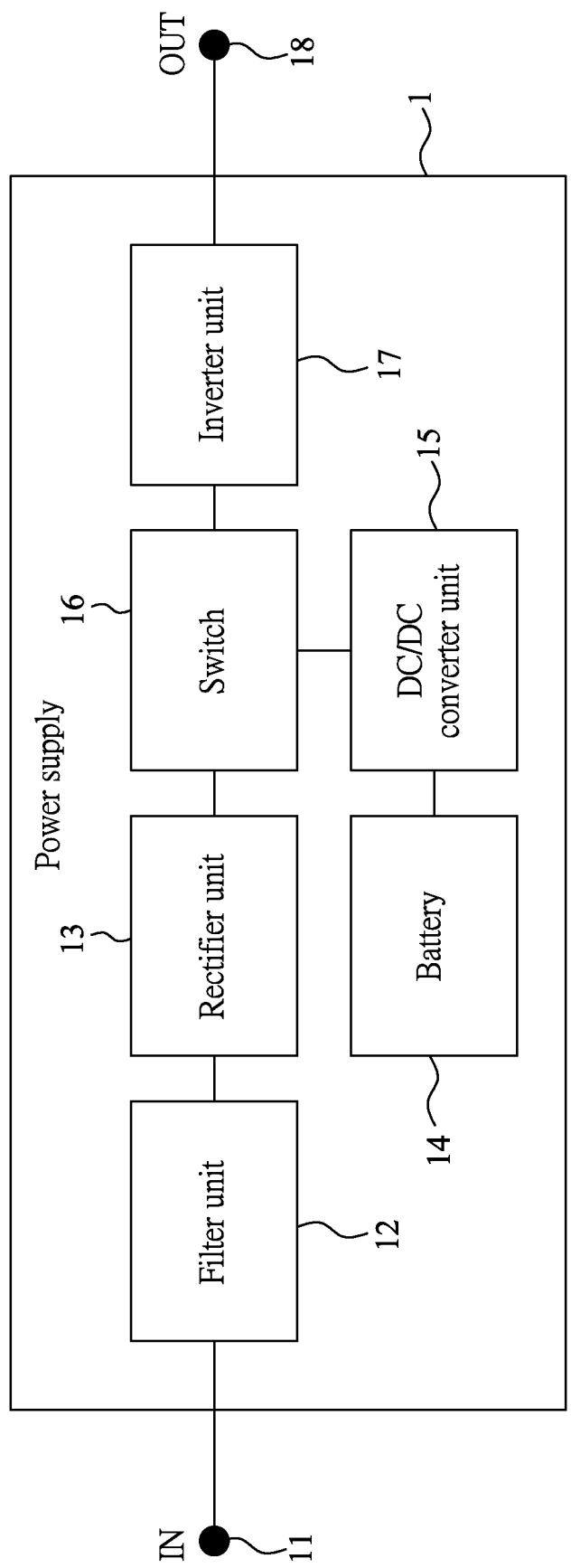
FIG. 2 is a block diagram of a power supply included in the uninterruptible power system of FIG. 1.

Please refer to FIG. 2. The power supply 1 includes an input component 11, a filter unit 12, a rectifier unit 13, a battery 14, a DC/DC converter unit 15, a switch 16, an inverter unit 17, and an output component 18. The input component 11 is used to receive an amount of alternating current (AC) from an external AC power source. The filter unit 12 filters the input alternating current and transmits the filtered alternating current to the rectifier unit 13. The rectifier unit 13 rectifies an input voltage of the alternating current. The battery 14 is used to store an amount of direct current (DC). The DC/DC converter unit 15 is used to regulate the direct current of the battery 14. The switch 16 is electrically connected to the DC/DC converter unit 15 and the rectifier unit 13, and selectively transmits the power from the rectifier unit 13 or the direct current from the DC/DC converter unit 15 to the inverter unit 17. The inverter unit 17 converts direct current to alternating current with matching specifications. The output component 18 is used to supply the alternating current to an external device.

The temperature sensors 2 are mounted on the battery 14 of the power supply 1 and are electrically connected to the microprocessor 5. The battery 14 includes a plurality of cells, and the temperature sensors 2 detect the temperature of the cells in one-to-one correspondence to generate real-time temperature values 21 that match different temperature ranges and are transmitted to the microprocessor 5. For example, cell temperatures detected by the temperature sensors 2 that fall in the temperature range from 23° C. to 27° C. all match the real-time temperature value 21 of 25° C.

The timer 3 is electrically connected to between the temperature sensors 2 and the microprocessor 5. When the battery 14 of the power supply 1 is supplying power, the timer 3 counts the continued time period 31 of a temperature range matching the corresponding real-time temperature value 21 of each cell and transmits the continued time periods 31 of the cells to the microprocessor 5.

Figure 3:
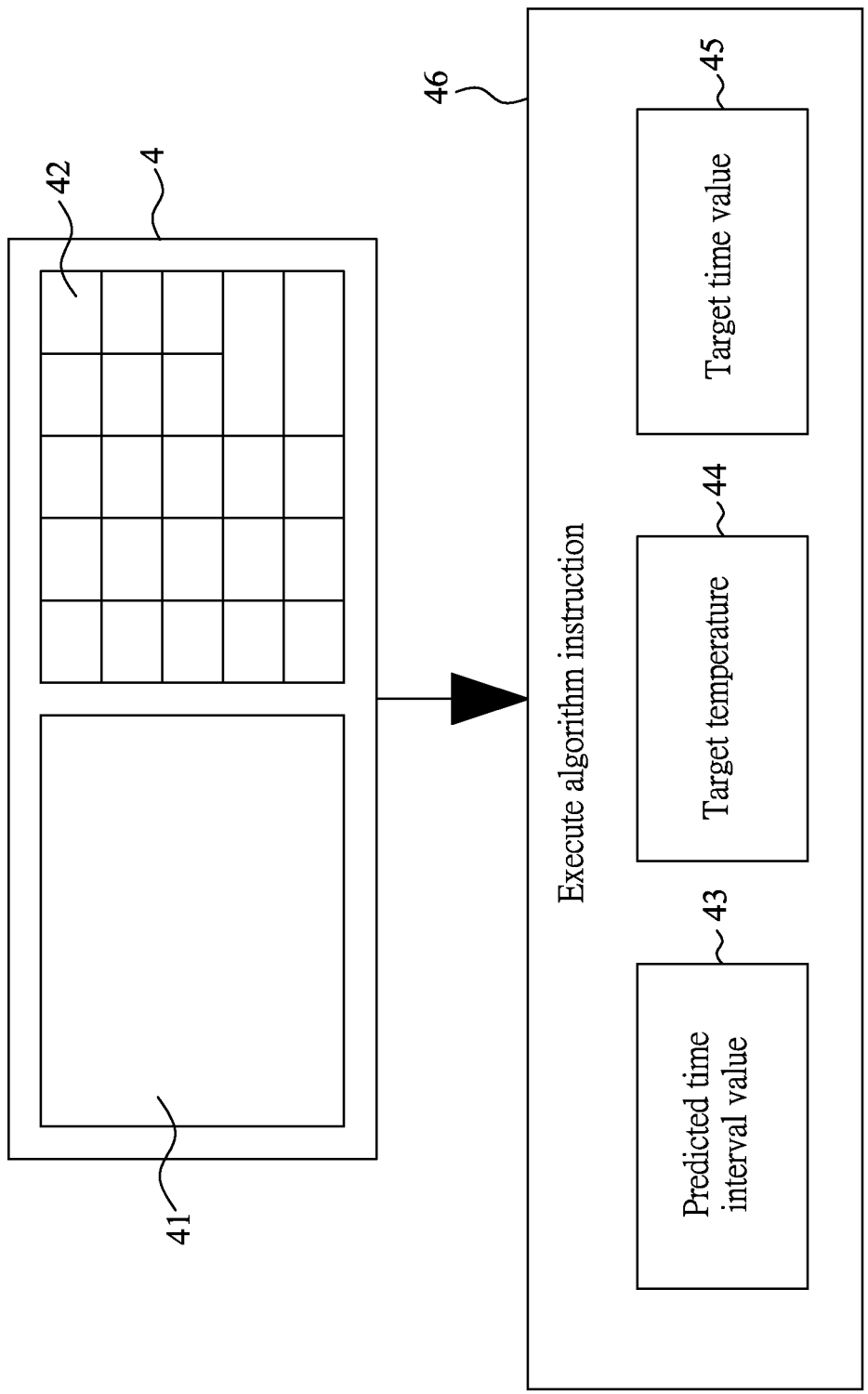
FIG. 3 is a block diagram of an operational interface included in the uninterruptible power system of FIG. 1.

Please refer to FIG. 3. The operational interface 4 is electrically connected to the microprocessor 5 and includes a display screen 41 and an input device 42 consisting of a plurality of keys. The display screen 41 can display a predicted time interval value option, a target temperature option and a target time value option for a user to select and adjust, and can also display the real-time temperature values 21 and the continued time periods 31. The user can monitor, control and operate the uninterruptible power system via the input device 42 and generate a predicted time interval value 43, a target temperature 44 and a target time value 45. After the three values are input, the operational interface 4 generates an execute algorithm instruction 46, which is then transmitted to the microprocessor 5.

The target temperature 44 can be generated in different manners. For example, the microprocessor 5 can directly select one preset temperature having a continued time period 31 of a highest proportion among all continued time periods 31 for use as the target temperature 44. Alternatively, the user can select at the operational interface 4 one of many temperature options for use as the target temperature 44.

Figure 4:
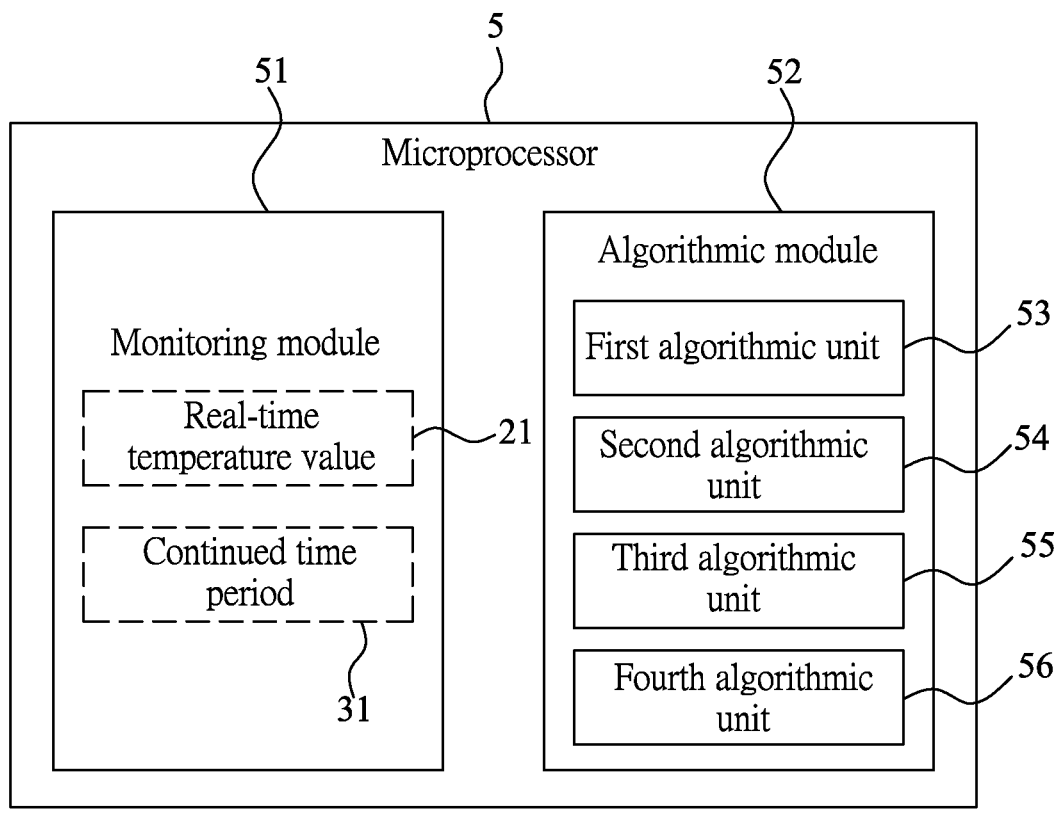
FIG. 4 is a block diagram of a microprocessor included in the uninterruptible power system of FIG. 1.

Please refer to FIG. 4. The microprocessor 5 includes a monitoring module 51 and an algorithmic module 52. The monitoring module 51 continuously receives the real-time temperature values 21 and the continued time periods 31 of the cells and transmits the received real-time temperature values 21 and the continued time periods 31 corresponding thereto to the storage unit 6. After receiving the execute algorithm instruction 46, the algorithmic module 52 retrieves from the operational interface 4 and the storage unit 6 various parameters required for the algorithm, so as to make certain how the state of use of the battery 14 of the power supply 1 is and whether the battery 14 is still qualified for using within a predetermined future time period.

In a preferred embodiment, a highest temperature of the real-time temperature values 21 of the same time sequence will be set by the monitoring module 51 as an algorithmic temperature, and the algorithmic temperature matches with the set temperature values and is used to accumulate the continued time periods 31.

Figures 5, 6:
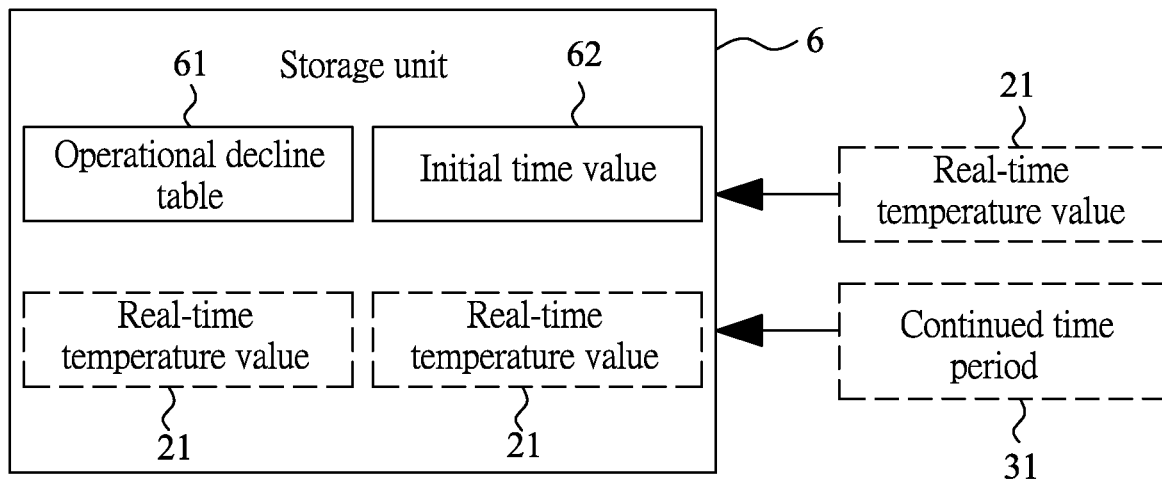
FIG. 5 is a block diagram of a storage unit included in the uninterruptible power system of FIG. 1.
FIG. 6 shows an example of an operational decline table used in the present invention.

Please refer to FIG. 5. The storage unit 6 has an operational decline table 61 and an initial time value 62 stored therein. The operational decline table 61 is set based on the cells. As can be seen in FIG. 6, the operational decline table 61 includes a plurality of set temperature values 63, a plurality of time parameter values 64, and a plurality of coefficients of decline 65. Further, the storage unit 6 also records the real-time temperature values 21 and the continued time periods 31 transmitted from the microprocessor 5.

As shown in FIG. 6, the operational decline table 61 shows a plurality of set temperature values 63 in increment of 5° C., that is, 25° C., 30° C., 35° C., 40° C. and 50° C., and a plurality of time parameter values 64 in time interval of one year. As to the coefficients of decline 65, they can be established according to actual test data produced during actual operation of the cells. However, it would lead to quiet a long testing time if all the coefficients of decline 65 are to be established according to the actual test data. Therefore, in a preferred embodiment, a part of the coefficients of decline 65, for example, the coefficients of decline for the first year, can be established according to the actual test data, while other parts of the coefficients of decline 65, such as those for the second to the fifth year, can be established according to simulated algorithmic data produced by calculation performed on the actual test data. Further, while the illustrated operational decline table 61 shows set temperature values 63 in increment of 5° C., a more accurate temperature value, for example, 32° C., might be required in actual need. In this case, the coefficients of decline 65 corresponding to the set temperature value of 32° C. can also be calculated through interpolation.

Figure 7:
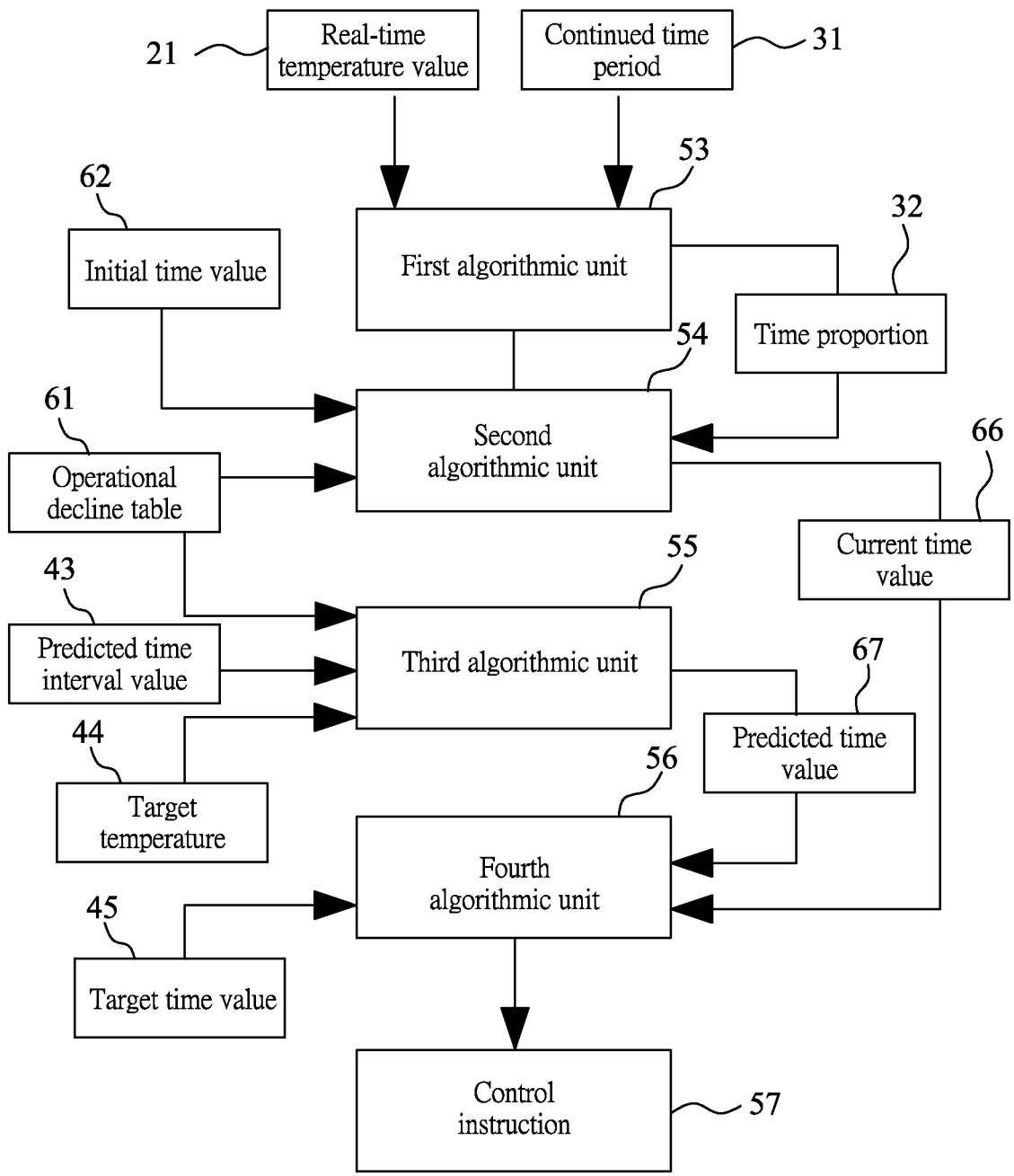
FIG. 7 is a flow chart showing the generation of a control instruction.

Please refer to FIG. 7. The algorithmic module 52 includes a first algorithmic unit 53, a second algorithmic unit 54, a third algorithmic unit 55 and a fourth algorithmic unit 56. The first algorithmic unit 53 retrieves the real-time temperature values 21 and the continued time periods 31 from the storage unit 6 and executes an algorithm based on the retrieved real-time temperature values 21 and continued time periods 31 to obtain a plurality of time proportions 32 matching the set temperature values 63 in one-to-one correspondence.

The second algorithmic unit 54 retrieves the operational decline table 61 and the initial time value 62 from the storage unit 6 and also retrieves the time proportions 32 from the first algorithmic unit 53, so as to produce a current time value 66 on the basis of the retrieved operational decline table 61, initial time value 62 and time proportions 32.

The third algorithmic unit 55 retrieves the operational decline table 61 from the storage unit 6 and retrieves the predicted time interval value 43 and the target temperature value 44 from the operational interface 4, so as to produce a predicted time value 67 on the basis of the retrieved operational decline table 61, predicted time interval value 43 and target temperature value 44.

The fourth algorithmic unit 56 retrieves the current time value 66 from the second algorithmic unit 54, retrieves the predicted time value 67 from the third algorithmic unit 55, and retrieves the target time value 45 from the operational interface 4, so as to generate a control instruction 57 according to the retrieved current time value 66, predicted time value 67 and target time value 45.

When the current time value 66 is larger than a sum of the predicted time value 67 and the target time value 45, the control instruction 57 would cause the uninterruptible power system to remind the user that the UPS would be unable to reach preset requirements when it is used after the predicted time interval value 43 and replacement of the battery 14 of the power supply 1 is to be considered. On the other hand, when the current time value 66 is smaller than a sum of the predicted time value 67 and the target time value 45, the control instruction 57 would cause the UPS to inform the user that the system can still meet the user's preset requirements when it is used after the predicted time interval value 43.

The indicator 7 is electrically connected to the microprocessor 5 and the control instruction 57 is transmitted to the indicator 7. According to the received control instruction 57, the indicator 7 gives a warning indication that the UPS could not reach the use requirements or an approval indication that the UPS meets the use requirements.

Since the battery 14 will become aged after having been used over a period of time, the length of an available load time of the battery 14 is shortened with time. Therefore, it is very important to know whether the power supply 1 can still satisfy the use requirements in a future time period. For instance, as shown in FIG. 6, it is supposed the battery 14 having been used for one year has an actually monitored state that the battery 14 has a temperature of 30° C. in 15% of the total continued time period 31, has a temperature of 35° C. in 70% of the total continued time period 31, and has a temperature of 40° C. in 15% of the total continued time period 31, and the initial time value 62 of the battery 14 is 4.1 minutes.

When the user inputs a predicted time interval value 43 of 6 months, a target temperature 44 of 35° C., and a target time value 45 of 3.5 minutes, the current time value 66 is derived from the following formula:

$$4.1-(1.10/1000*15\%+1.30/1000*70\%+1.40/1000*15\%)*360=3.64 \text{ minutes}$$

And, the predicted time value 67 is calculated as follows:

$$0.55/1000*100\%*180=0.099 \text{ minutes}$$

Wherein, a difference between the current time value 66 and the predicated time value 67 (3.64 minutes–0.099 minutes) is larger than the target time value 45 of 3.5 minutes. Therefore, the battery 14 of the power supply 1 can still satisfy the use requirements in the subsequent six months. In the event the difference between the current time value 66 and the predicated time value 67 indicates the battery 14 could not satisfy the use requirements in the subsequent six months, the indicator 7 will give a warning to remind the user to replace the battery 14.

Further, the microprocessor 5 stores the current time value 66 in the storage unit 6 periodically at a preset time period to form an update time value, and instructs the storage unit 6 to update the current time value 66 based on the operational decline table 61 and the newly calculated update time value and the time proportions 32.

Figure 8:
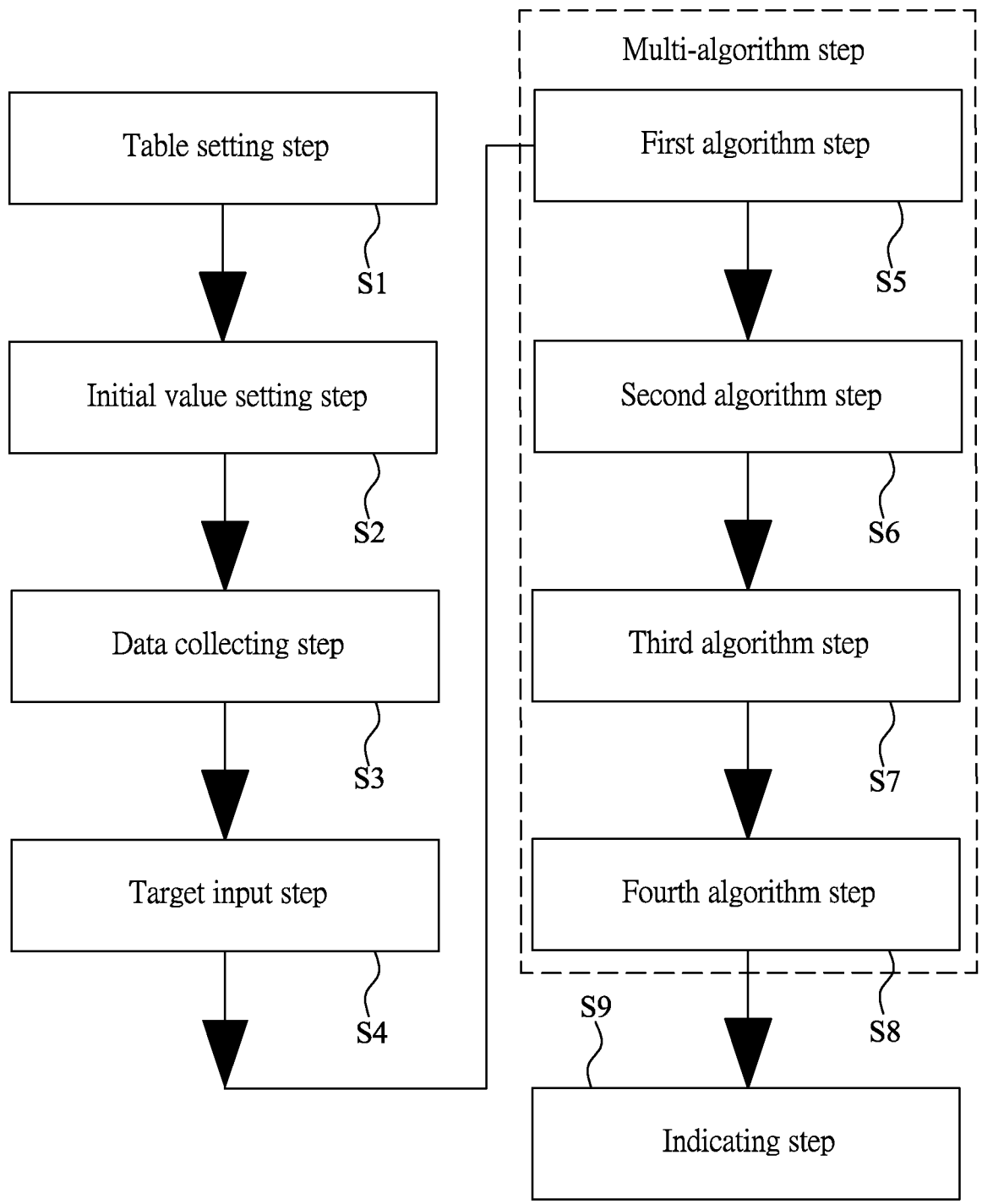
FIG. 8 is a flow chart showing the steps included in an uninterruptible power system testing method according to the present invention.

Please refer to FIG. 8. A method for testing the state of the power supply 1 of the uninterruptible power system according to the present invention includes a table setting step S1, an initial value setting step S2, a data collecting step S3, a target input step S4, a first algorithm step S5, a second algorithm step S6, a third algorithm step S7, a fourth algorithm step S8, and an indicating step S9. Wherein, the first algorithm step S5, the second algorithm step S6, the third algorithm step S7 and the fourth algorithm step S8 together constitute a multi-algorithm step. According to the testing method, when the indicating step S9 is completed, the user is informed of a state of the power supply 1 in real time.

In the table setting step S1, standard cells actually adopted in the uninterruptible power system are repeatedly tested when they are actually used at different temperatures, so as to set the operational decline table 61, which is then stored in the storage unit 6 of the uninterruptible power system. Wherein, the actual test data is obtained by letting the initially tested cells undergo an electrical discharge procedure and measuring an initial state of capacity and impedance of these cells. Then, the cells are stored in environments of different temperatures for a period of time and let the stored cells undergo the same electrical discharge procedure, and the cells' capacities and impedances after decline can be measured to generate the coefficients of decline 65. On the other hand, the simulated algorithmic data is a prediction of the decline of the capacities and impedances of the relatively aged cells based on linear and exponential trend lines thereof.

In the initial value setting step S2, an algorithm is executed according to time values generated in the electrical discharge procedure of the standard cells, so as to obtain the initial time value 62 that matches the entire power supply 1; and the initial time value 62 is also stored in the storage unit 6 of the uninterruptible power system.

In the data collecting step S3, the temperature sensors 2 continuously collect a plurality of real-time temperature values 21 of the power supply 1, and the timer 3 conducts calculation on every temperature sensor 2 to obtain the continued time period 31 of each real-time temperature value 21. The real-time temperature values 21 and the continued time periods 31 are continuously transmitted to and recorded in the storage unit 6. Wherein, the operational decline table 61 and the initial time value 62 are directly programmed in the storage unit 6 prior to the operation of the uninterruptible power system, while the real-time temperature values 21 and the continued time periods 31 are generated only when the uninterruptible power system is operating and will be recorded in the storage unit 6.

In the target input step S4, the user operates at the operational interface 4 by himself to generate the predicted time interval value 43, the target temperature 44, the target time value 45 and the execute algorithm instruction 46. The predicted time interval value 43, the target temperature 44 and the target time value 45 are integrated into the execute algorithm instruction 46, which is then transmitted to the microprocessor 5.

In the first algorithm step S5, the microprocessor 5 executes an algorithm based on an accumulated time of the continued time periods 31 that are in one-to-one correspondence to the real-time temperature values 21, so as to derive a plurality of time proportions 32 with each of the set temperature values 63 having a single matching time proportion 32.

In the second algorithm step S6, the microprocessor 5 generates the current time value 66 according to the operational decline table 61, the time proportions 32 and the initial time value 62. The current time value 66 is an estimated duration of electrical discharge of the uninterruptible power system in the current state, instead of a real discharge procedure of the power supply 1.

In the third algorithm step S7, the microprocessor 5 generates the predicted time value 67 according to the operational decline table 61, the predicted time interval value 43 and the target temperature 44. In the fourth algorithm step S8, the microprocessor 5 generates the control instruction 57 according to the current time value 66, the predicted time value 67 and the target time value 45.

From the above description, it is understood that, in the multi-algorithm step, multiple times of algorithm are executed based on the real-time temperature values 21, the continued time periods 31, the operational decline table 61, the initial time value 62, the predicted time interval value 43, the target temperature 44 and the target time value 45.

In the indicating step S9, the indicator 7 received the control instruction 57 gives the warning indication or the approval indication. The approval indication represents the battery of the power supply 1 can still fulfill the use requirements without the necessity of changing the battery to a new one. On the other hand, when the warning indication is given, the user may consider recalculating at least one of the predicted time interval value 43 and the target time value 45 until the warning indication is changed to the approval indication. In this way, the user can find out the time to change the battery of the power supply 1.

Figure 9:
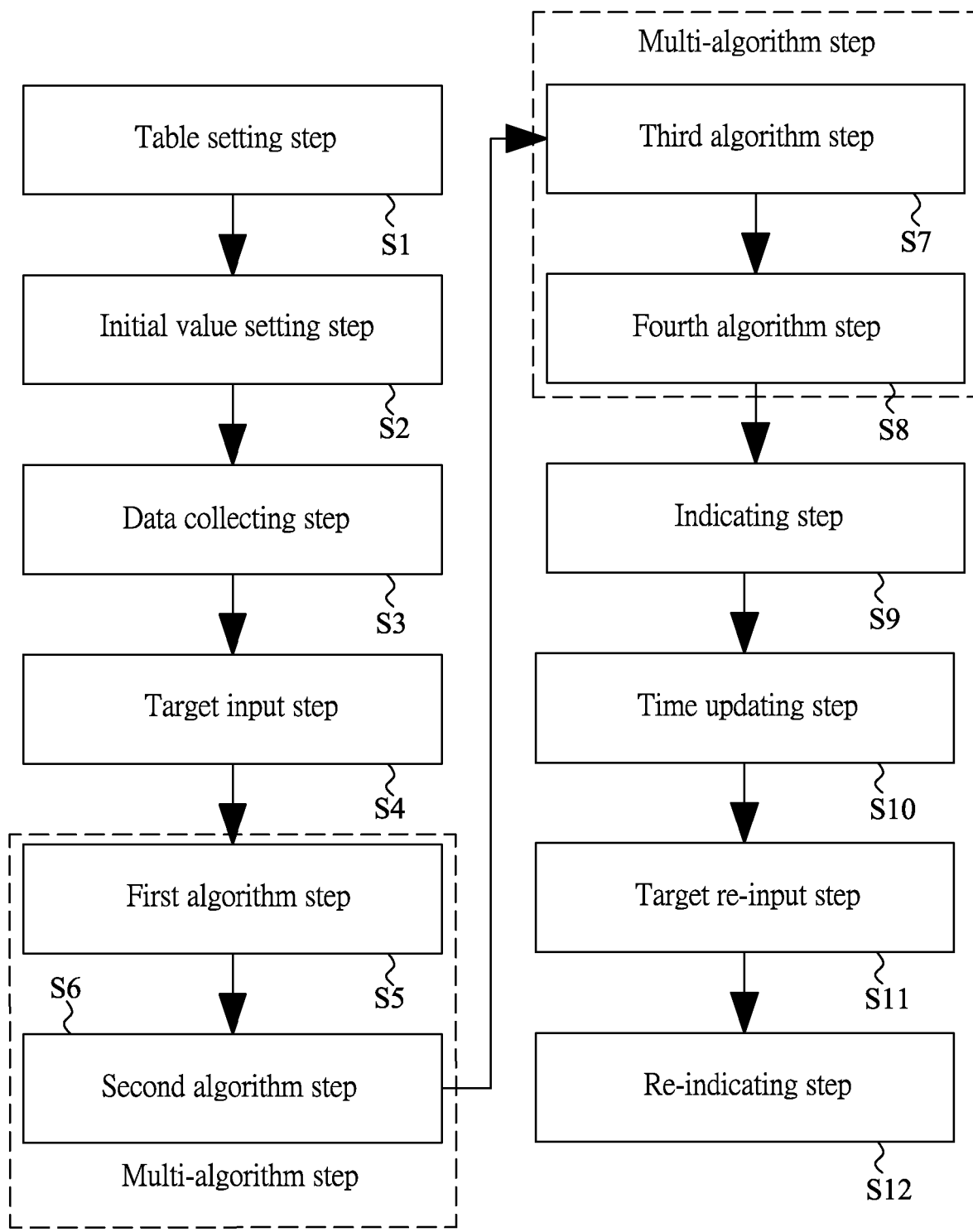
FIG. 9 is another flow chart showing the steps included in an uninterruptible power system testing method according to the present invention.

The testing method of the present invention enables data calculation and deletion periodically to reduce a memory space required by the storage unit 6. Please refer to FIG. 9. The testing method further includes a time updating step S10, a target re-input step S11 and a re-indicating step S12.

In the time updating step S10, the storage unit 6 stores the current time value 66 to replace the initial time value 62 and form an updated time value, and deletes the previously stored real-time temperature values 21 and continued time periods 31.

In the target re-input step S11, an updated predicted time interval value, an updated target temperature, an updated target time value and a re-execute algorithm instruction are generated through user operation at the operational interface 4.

In the re-indicating step S12, the indicator 7 receives a further control instruction from the microprocessor 5 to give the warning indication or the approval indication. Wherein, the microprocessor 5 repeats the first to the fourth algorithm step S5-S8 to generate the further control instruction, and the current time value 66 is generated according to the operational decline table 61, the time proportions 32 and the updated time value.

The present invention has been described with some preferred embodiments thereof and it is understood that many changes and modifications in the described embodiments can be carried out without departing from the scope and the spirit of the invention that is intended to be limited only by the appended claims.

What is claimed is:

1. An uninterruptible power system testing method, comprising the following steps:
   a table setting step, in which cells of a power supply of an uninterruptible power system (UPS) are repeatedly tested when they are actually used at different temperatures, so as to set an operational decline table; and the operational decline table is stored in a storage unit of the UPS and includes a plurality of set temperature values, a plurality of time parameter values and a plurality of coefficients of decline;
   an initial value setting step, in which an electrical discharge time of each cell is used to generate an initial time value matching the plurality of cells of the power supply, and the initial time value is stored in the storage unit;
   a data collecting step, in which a plurality of temperature sensors are used to continuously collect a plurality of real-time temperature values of the power supply matching different temperature ranges, and a timer is used to obtain a continued time period of each of the real-time temperature values in their respective matching temperature range; and the real-time temperature values and the continued time periods are stored in the storage unit;
   a target input step, in which a predicted time interval value, a target temperature, a target time value and an execute algorithm instruction are generated by an operational interface of the UPS; and the generated predicted time interval value, target temperature, target time value and execute algorithm instruction are transmitted to a microprocessor of the UPS;
   a multi-algorithm step, in which multiple algorithms are executed based on the real-time temperature values, the continued time periods, the operational decline table, the initial time value, the predicted time interval value, the target temperature and the target time value to generate a control instruction; and
   an indicating step, in which an indicator of the UPS receives the control instruction and accordingly, gives one of a warning indication and an approval indication.

2. The uninterruptible power system testing method as claimed in claim 1, wherein the multi-algorithm step further includes:
   a first algorithm step, in which the microprocessor executes an algorithm based on an accumulation of the continued time periods of the real-time temperature values, so as to derive a plurality of time proportions with each of the set temperature values having a single matching time proportion;
   a second algorithm step, in which the microprocessor generates a current time value for a current state according to the operational decline table, the time proportions and the initial time value;
   a third algorithm step, in which the microprocessor generates a predicted time value according to the operational decline table, the predicted time interval value and the target temperature; and
   a fourth algorithm step, in which the microprocessor generates the control instruction according to the current time value, the predicted time value and the target time value.

3. The uninterruptible power system testing method as claimed in claim 2, further comprising a time updating step, in which the storage unit stores the current time value in replace of the initial time value to form an updated time value and deletes the previously stored real-time temperature values and continued time periods.

4. The uninterruptible power system testing method as claimed in claim 3, further comprising a target re-input step, in which an updated predicted time interval value, an updated target temperature, an updated target time value and a re-execute algorithm instruction are generated through an operation at the operational interface; and
   a re-indicating step, in which the indicator receives a further control instruction from the microprocessor to give one of the warning indication and the approval indication; wherein the microprocessor repeats the first to fourth algorithm steps to generate the further control instruction, and the current time value is generated according to the operational decline table, the time proportions and the updated time value.

5. The uninterruptible power system testing method as claimed in claim 1, wherein, a partial data of the operational decline table is actual test data produced from the actual operation of the cells, and other data of the operational decline table are simulated algorithmic data produced from calculation performed on the actual test data.

6. The uninterruptible power system testing method as claimed in claim 1, wherein a highest temperature among the real-time temperature values of the same time sequence is set by the microprocessor as an algorithmic temperature, and a plurality of algorithmic temperatures that matches the set temperature values are used to accumulate the continued time period of each of the set temperature values.

7. The uninterruptible power system testing method as claimed in claim 1, wherein the target temperature is generated in one of two different manners; in the first manner, one set temperature value having a continued time period of a highest proportion among all continued time periods is selected by the microprocessor as the target temperature; and in the second manner, one of many temperatures is generated by the operational interface for use as the target temperature.

* * * * *